(12) United States Patent
Smith

(10) Patent No.: US 6,543,738 B2
(45) Date of Patent: Apr. 8, 2003

(54) INTEGRAL FLUSH SHOCK MOUNT

(75) Inventor: Gordon James Smith, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/910,673

(22) Filed: Jul. 20, 2001

(65) Prior Publication Data

US 2003/0015639 A1 Jan. 23, 2003

(51) Int. Cl.[7] ................. A47B 95/00; F16M 13/00; H05K 7/10
(52) U.S. Cl. ............... 248/345.1; 248/612; 248/615; 361/808
(58) Field of Search ............ 248/345.1, 560, 248/638, 562, 568, 609, 612, 615; 361/685, 808, 809

(56) References Cited

U.S. PATENT DOCUMENTS

| | | | | |
|---|---|---|---|---|
| 2,828,095 A | * | 3/1958 | Beck et al. | 248/612 |
| 2,849,201 A | * | 8/1958 | Schelgunov | 248/615 |
| 3,325,692 A | * | 6/1967 | Manetti et al. | 361/808 |
| 4,852,744 A | * | 8/1989 | Van Breemen | 206/453 |
| 5,081,552 A | * | 1/1992 | Glaser et al. | 360/903 |
| 5,216,582 A | * | 6/1993 | Russell et al. | 248/638 |
| 5,394,306 A | * | 2/1995 | Koenck et al. | 248/613 |
| 5,703,734 A | * | 12/1997 | Berberich et al. | 361/685 |
| 6,103,335 A | * | 8/2000 | Zoller et al. | 248/345.1 |

* cited by examiner

Primary Examiner—Anita King
(74) Attorney, Agent, or Firm—Robert W. Lahtinen

(57) ABSTRACT

A shock mount structure is shown that has one position wherein shock mount members positioned at the corners of the device are contained within the length, width, and height of the form factor with which the device complies and a second position wherein the elastomeric corner members violate the form factor, but are positioned to impact a planar surface, toward which the device is dropped, before any portion of the device, irrespective of the attitude of the device as it approaches the planar surface. To assure protection, the elastomeric corner shock mount elements are urged toward the second position by integral springs and are manually movable to the first position by overcoming the biasing force of the springs.

13 Claims, 6 Drawing Sheets

INTEGRAL FLUSH SHOCK MOUNT

FIELD OF THE INVENTION

The present invention pertains to shock mounting structures and more particularly to a shock mount structure that may be contained within the dimensions of a form factor, but is movable to a position violating the form factor, but protecting the device when dropped in any attitude.

BACKGROUND OF THE INVENTION

Shock isolation is important for all precision devices such a disk drives and becomes more important for current small devices, such as those confined within a Personal Computer Memory Card International Association (PCMCIA) or microdrive form factors, which are more likely to be subject to casual and frequent transport and accidental dropping. This is particularly true when more than one device must be used in a single bay of a system, requiring the devices to be frequently interchanged and handled.

In many cases it is adequate to provide shock protection at the corners of a device within the form factor. On most occasions a device falls randomly with one corner lower to encounter the initial impact with the surface above which the device is dropped. However, such protection is ineffective when the impact is nearly face-flat with the surfaces substantially parallel at the moment of engagement or if dropped on an edge. This type of impact is particularly dangerous since it represents the worst case for disk drive head-disk interface failure and spindle failure modes. Shock protection should be adequate when the device is dropped irrespective of device orientation when impact occurs with the underlying surface. Further, the entire device must be contained within the dimensions of the form factor when installed for use within a host apparatus. However, when the device is not installed it is permissible to violate the form factor.

SUMMARY OF THE INVENTION

The invention utilizes movable, integral shock mount members at each corner of a miniature electronic device such as a PCMCIA type II form factor or a microdrive form factor. In one position the elastomeric corner portions are flush with the exterior of the device and within the dimensions of the form factor. When the device is removed from the host device, the elastomeric corner members may be rotated to a position where mechanical shock protection is provided if the device is inadvertently dropped. This protection is important, since such small devices are at times difficult to handle. The structure of the invention is capable of maintaining the form factor of a micro-sized device when the device is in use, but violate the form factor when the device is handled while removed from the host apparatus to protect the delicate parts within the device from damage that would render the device inoperative. To assure mechanical protection of the device, when not mounted in a host and confined to the form factor, the shock mount corner members are biased toward the form factor violating protective position. The shock mount members are manually movable, against the biasing force, to a position within the form factor for reinstallation of the device in the host apparatus.

In addition to being biased ninety degrees to the from factor violating, protective position, the shock mount corner members are biased outward. In the protective position, with the shock mount members rotated and biased outward, the shock mounts will be the first to engage any planar surface over which the device may be dropped irrespective of the attitude of the device at the instant of impact.

In another mode of practicing the invention, elastomeric shock mount members are mounted at truncated corners of the device within the form factor when in a first position. When moved to a second position, the sides of the elastomeric shock mounts move outward parallel to the device sides to violate the form factor and upper and lower surfaces of the elastomeric shock mount are distorted to exceed the third dimension of the form factor. With the shock mount in the second position, this embodiment also protects the device if dropped toward a planar surface irrespective of device attitude at contact.

Small devices such as micro drives are not only delicate precision structures, but due to the small size are often difficult to handle and properly secure for transport. When used with a portable host apparatus having limited resources for receiving auxiliary apparatus, it is often necessary to interchange devices to achieve multiple functions. When not installed, miniature devices are occasionally casually handled and subject to being dropped. Thus, mechanical protection of micro devices is required to have the device and any data carried by the device reliably available.

DETAILED DESCRIPTION

Figure 1:
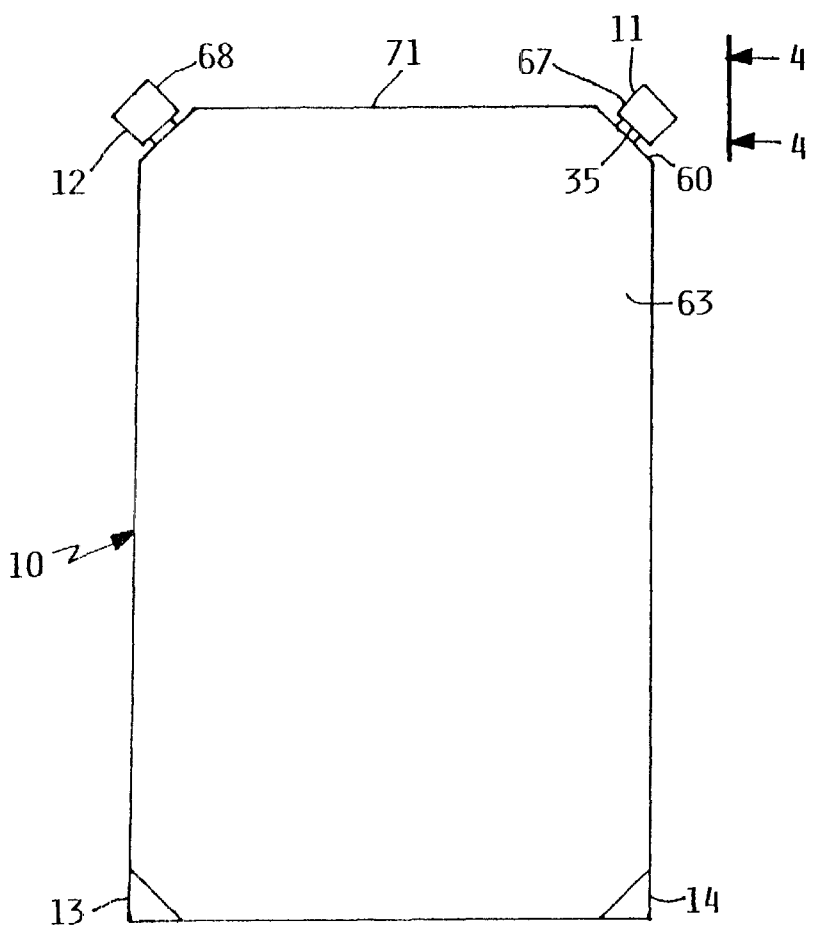
FIG. 1 is a plan view of a device within a PCMCIA type II form factor which incorporates the integral shock mount structure of the present invention.

FIG. 1 illustrates a device 10 in the form of a Personal Computer Memory Card International Association (PCMCIA) type II standard or form factor. The form factor dimensions are 85.6×54.0×5.0 millimeters. The four elastomer shock mount corner members 11, 12, 13, 14 are shown with the two lower members 13, 14 in the operative position wherein they have been manually rotated to be contained within the form factor dimensions and the upper members 11, 12 are in the protective position wherein they are rotated a quarter turn and biased outward (both of which motions cause a violation of the form factor).

Figure 2:
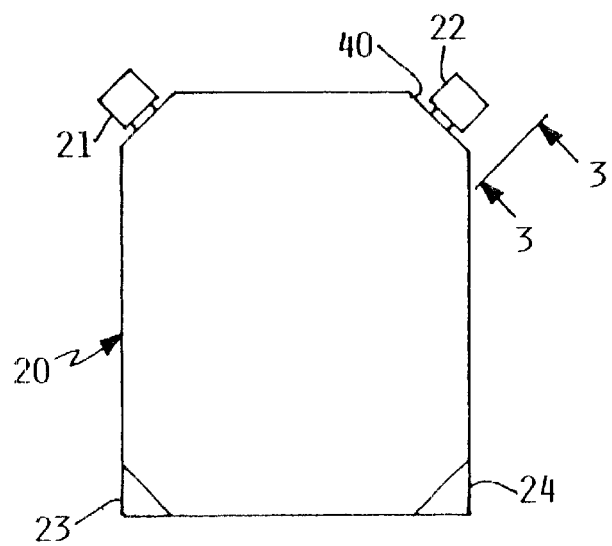
FIG. 2 is a plan view, similar to that of FIG. 1, showing the integral shock mount structure of the present invention in the environment of a microdrive form factor.

FIG. 2 is similar to FIG. 1, but shows the shock mounts of the present invention in the environment of a device 20 having a microdrive form factor which is contained within the dimensions of 42.8×36.4×5.0 millimeters. The shock mounts 21, 22 at the upper corners are shown in the protective position and the shock mounts 23, 24 at the lower corners in the operative position.

Figure 3:
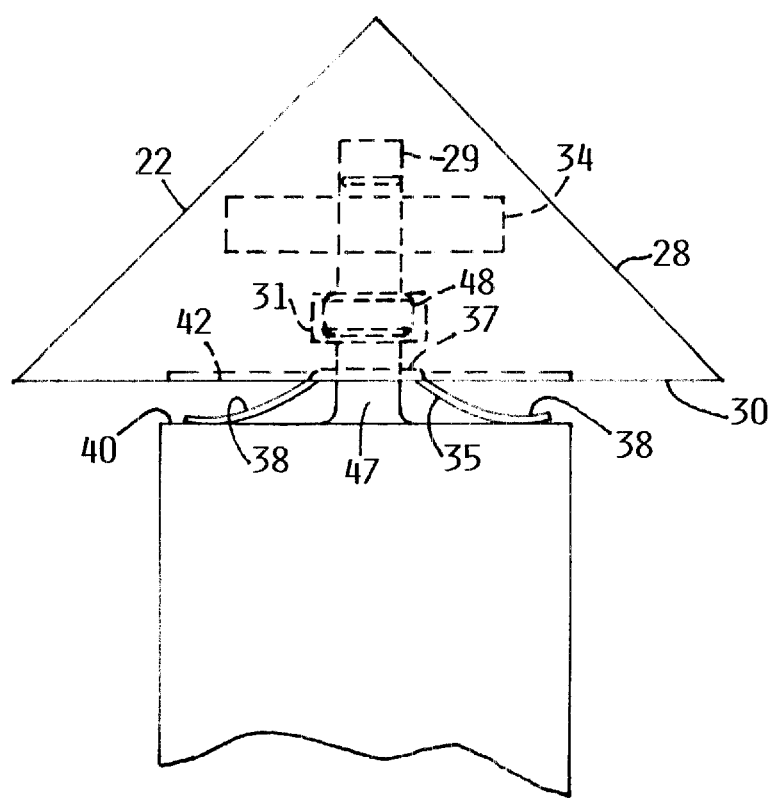
FIG. 3 is a view of an integral corner shock mount structure taken along line 3—3 of FIG. 2, with internal structural details shown in phantom view.
Figure 5:
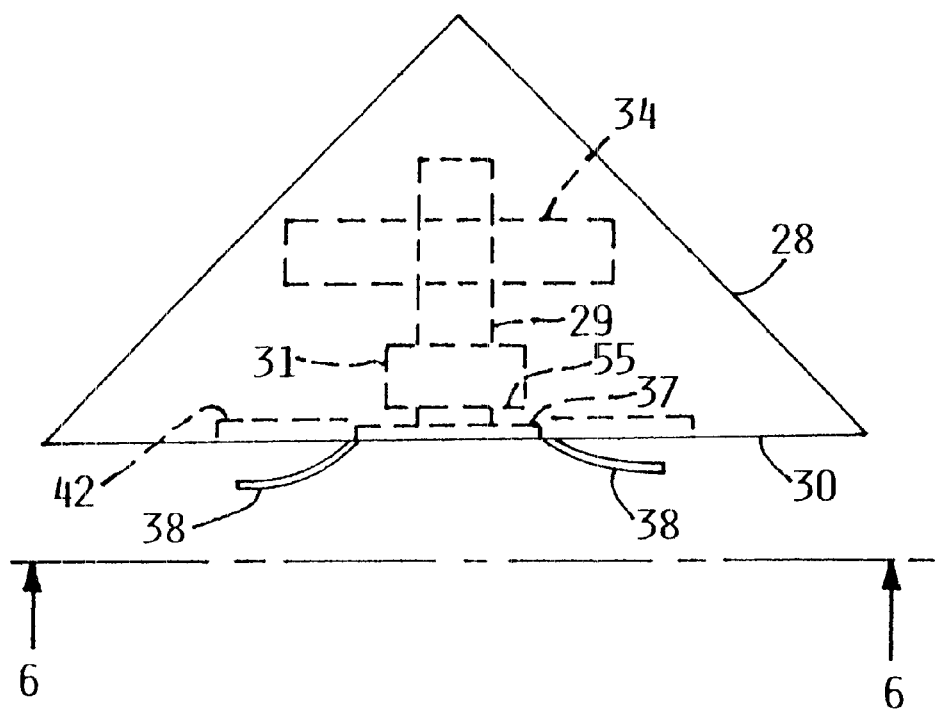
FIG. 5 is a side elevation of an elastomeric shock mount of the present invention with internal details shown in phantom view.
Figure 6:
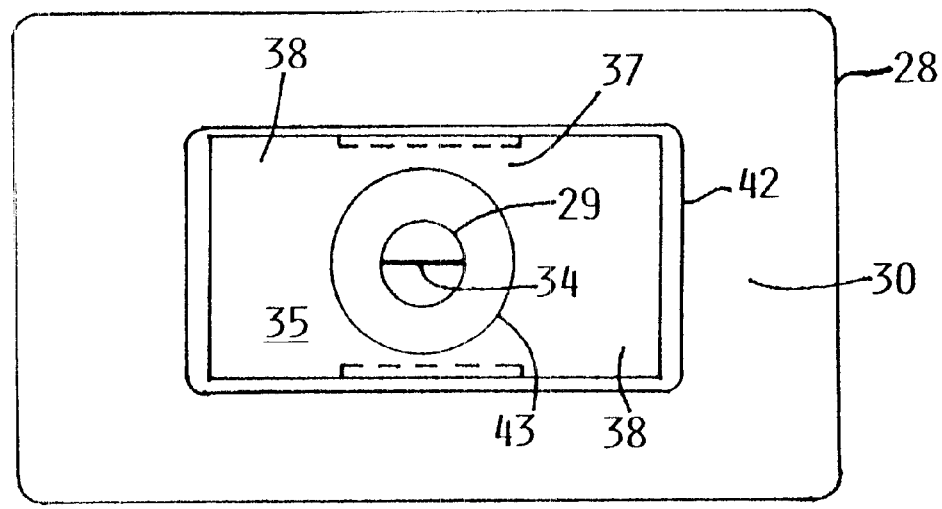
FIG. 6 is a view of the member illustrated in FIG. 5 taken along line 6—6 of FIG. 5.

FIG. 3 shows one of the elastomeric shock mount members 22 in the protective position with concealed portions of the assembly in phantom view. The shock mount assembly 22 (as seen in FIGS. 5 and 6) has an elastomer portion including a cylindrical opening 29 extending from the lower surface 30 and includes an enlarged portion 31. Elastomeric member 28 is formed with two inserts 34 and 35. Leaf spring insert 34 is captured within the molded elastomer and bisects the cylindrical opening 29. The second insert is a spring member 35 which has flange portions 37 captured by the molded elastomer and end portions 38 that engage the wall surface 40 of device 20 and biases the shock mount away from the device frame when not confined in the operative position within the form factor. A recess 42 in the elastomer member 28 surrounding the spring member 35 receives the compressed spring terminal end portions 38 when the shock mount is manually urged to the operative position. An enlarged opening 43 (shown in FIG. 6) in spring member 35 enables the elastomeric material at the base of the cylindrical opening 29 to be displaced as the shock mount is assembled onto the device.

Figure 8:
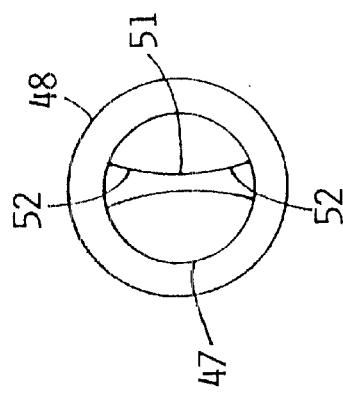
FIG. 8 is an axial end view of the slotted post of FIG. 7 taken along line 8—8.
Figure 7:
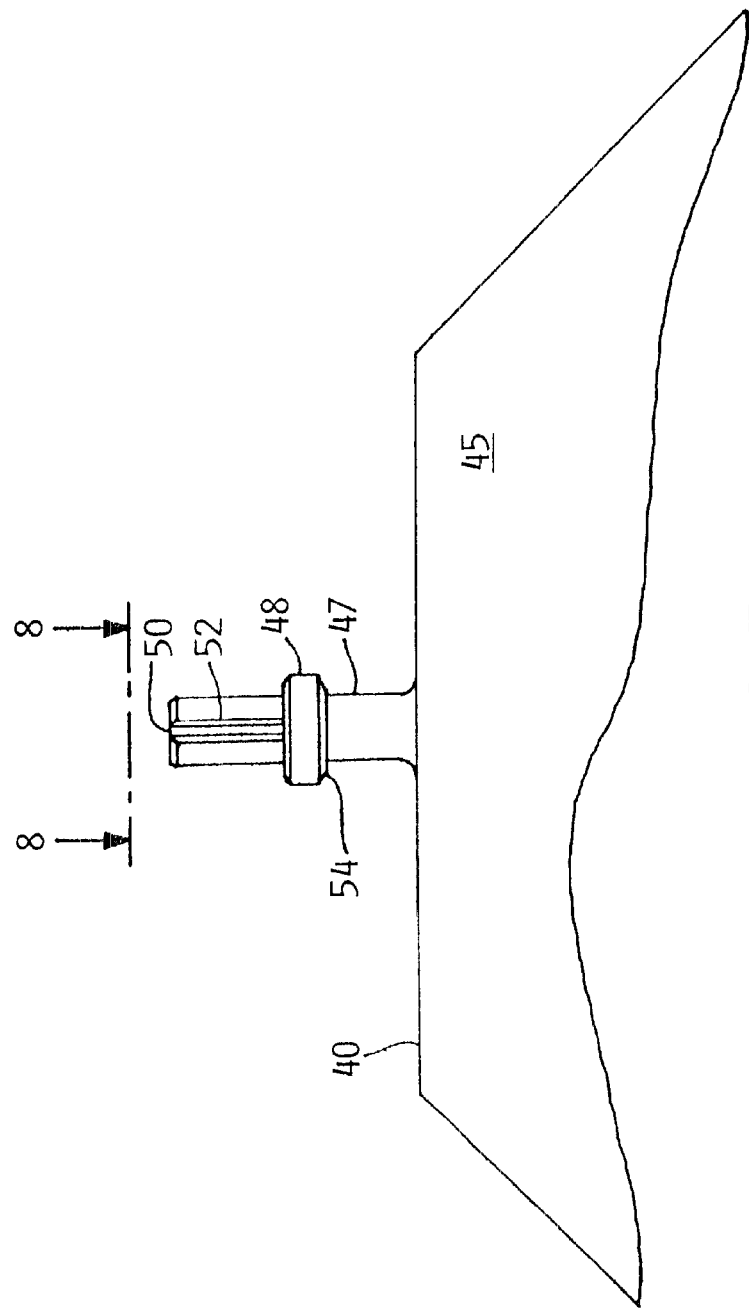
FIG. 7 is a plan view of a corner portion of a device frame including a post structure for receiving the shock mount member of FIG. 5.

As shown in FIGS. 7 and 8, the device frame 45 includes a post member 47, formed as an integral part of the frame, that is generally cylindrical and includes an intermediate enlarged portion 48 and a terminal slotted opening 50 which receives the leaf spring insert 34 in the assembled condition. As shown in FIG. 8, the slotted opening 50 has substantially parallel side portions 51 at the center of the slot which closely confine spring 34 and diverging surfaces 52 extending to the slot opening at the periphery of post 47 to prevent localized stress on spring 34 when the shock mount assembly is assembled about post 47 and rotated a quarter turn to the operative position.

The elastomeric shock mount assembly 22 is assembled about the supporting post 47 by forcing the elastomeric material surrounding the cylindrical opening base over the enlarged portion 48 of post 47 to position the enlarged post portion in the enlarged portion 31 of the elastomer cylindrical opening 29. Such assembly is effected with the shock mount in the rotated protective position so that the leaf spring 34 is received in the post slot 50. When the shock mount 22 is assembled about the post 47, the spring 35 urges the shock mount outward to cause the lower surface 54 of the post enlarged portion to engage the wall portion 55 of the elastomer enlarged portion extending from the cylindrical opening 29. The shock mount 22 is placed in the operational position within the device form factor by rotating the shock mount 90 degrees against the biasing force of leaf spring 34 and compressing spring 35 to place the shock mount within the dimensions of the device form factor.

Figure 4:
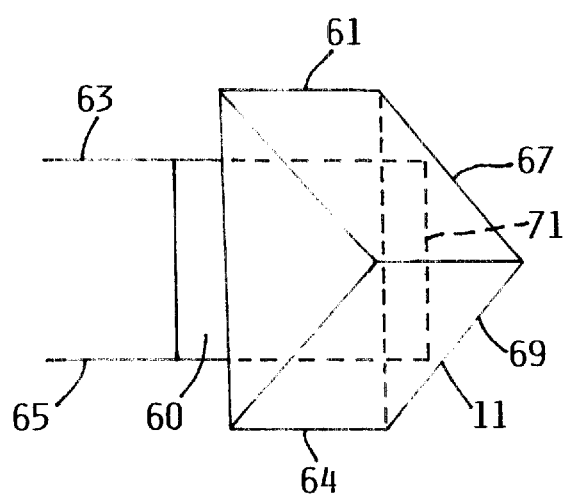
FIG. 4 is a view of an integral corner shock mount taken along line 4—4 of FIG. 1 with certain obscured portions illustrated by dashed lines.

FIG. 4 illustrates the shock mount 11 in the protective position (as also shown in the assembly view of FIG. 3) with the mount rotated and biased away from the confronting device wall portion 60 by the spring 35 (not visible in the view of FIG. 4). The upper edge 61 of shock mount 11 in cooperation with the corresponding edges of the other three shock mounts defines a plane above the device surface 63. Similarly, the lower edge 64 in cooperation with the corresponding lower edge surfaces of the other three shock mounts define a plane below the device bottom surface 65. There are also planes defined about the sides and ends of the device that function, in combination, to completely surround the device. For example, these include a plane determined by the shock mount 11 edge 67 and the shock mount 12 edge 68 (visible in FIG. 1) which, with a plane defined by the edge 69 and the corresponding edge of shock mount 12 (FIG. 1), establish intersecting planes beyond the device end surface 71. Accordingly, with the shock mounts in the protective position, there is no attitude that the device can present when approaching a planar surface wherein the shock mounts will not engage such planar surface prior to any portion of the protected device.

Another form of the invention is illustrated in FIGS. 10 through 13. In this embodiment shock mounting is provided for a device 74, such as the microdrive of FIG. 2, with elastomeric shock mount members 75 mounted at the truncated corners of the device 74.

Figure 9:
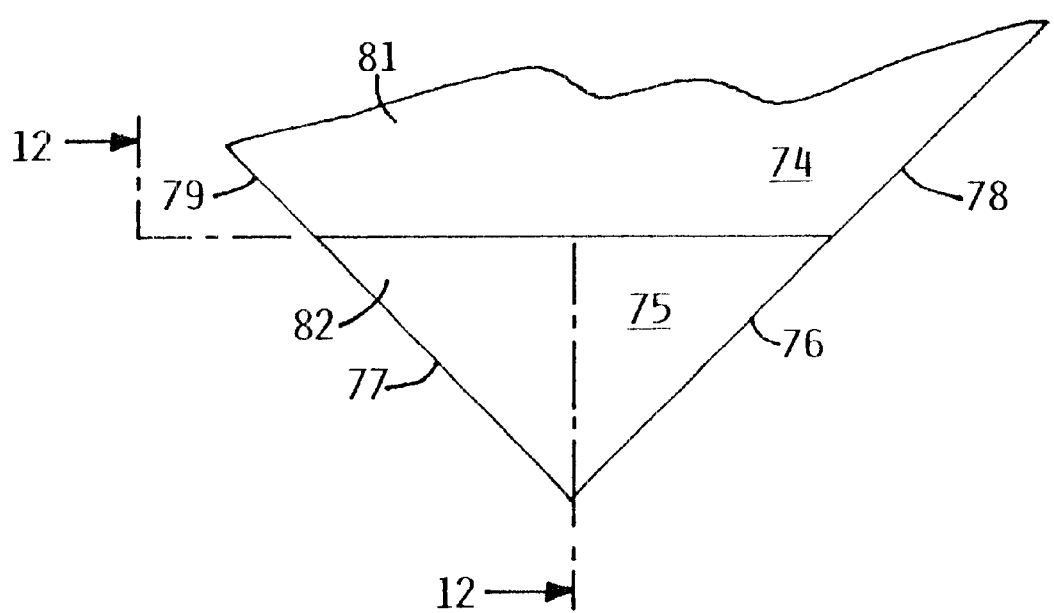
FIG. 9 illustrates a second embodiment of the invention showing an elastomeric shock mount at the truncated corner of a device in a first position within the device form factor.
Figure 10:
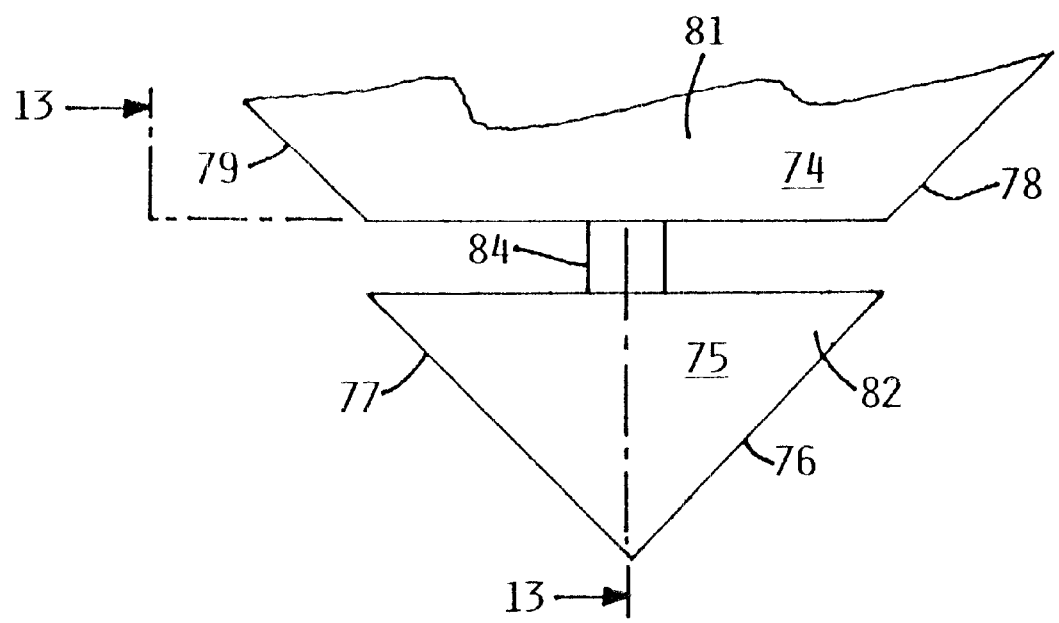
FIG. 10 shows the apparatus of FIG. 9 with the shock mount in a second position in which then device form factor is violated.

In this embodiment, the elastomeric corner shock mount 75 is likewise within the device form factor in a first position as shown in FIG. 9. Here the shock mount side surfaces 76 and 77 are respectively coplanar with device side surfaces 78 and 79, while upper and lower surfaces of shock mount and device are likewise coplanar as seen with device upper surface 81 and shock mount upper surface 82. When shock mount 75 moves outward to the second position, as illustrated in FIG. 10, the shock mount side surfaces 76 and 77 translate to a position respectively parallel to device sides 78 and 79 and outside the dimensions of the form factor determined by the dimensions of device 74.

Each shock mount is supported at a truncated device corner by a rectangular projection 84, that has at the terminal end a bulbous portion 85, and is received in a recess 86 extending into the shock mount. With the shock mount in the first position, the project end portion 85 is received in the enlarged terminal end 87 of the shock mount recess. It will also be noted that the recess 86 includes an intermediate relieved portion 88 (FIG. 12) which serves as a detent when the shock mount is moved outward along projection 84 to the second position.

Figure 11:
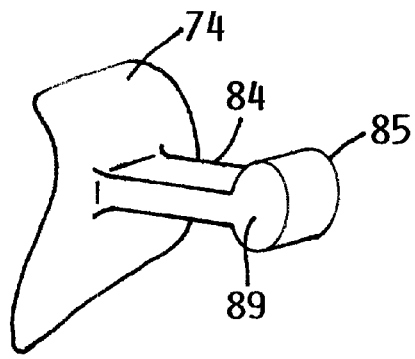
FIG. 11 illustrates the projection about which the shock mounts of FIGS. 9 and 10 are mounted.

FIG. 11 illustrates the rigid projection 84 extending from the device 74 to support the elastomeric shock mount 75. The projection 84 terminates at the distal end in an enlarged, bulbous portion 85. The projection 84 has flat parallel sides 89 and thus there is no increase in dimension from side to side. Projection 84 being rectangular (non-round) resists any rotation of the shock mount as it is moved between the first and second positions.

Figure 12:
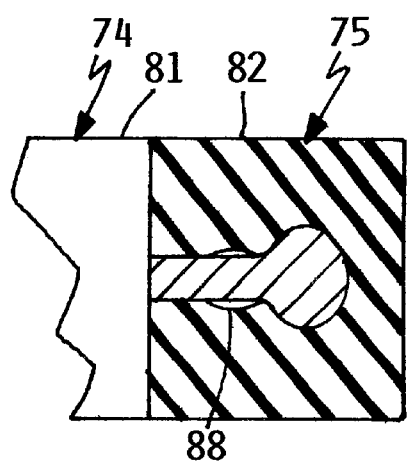
FIG. 12 is an elevation, partially in section, taken along line 12—12 of FIG. 9.
Figure 13:
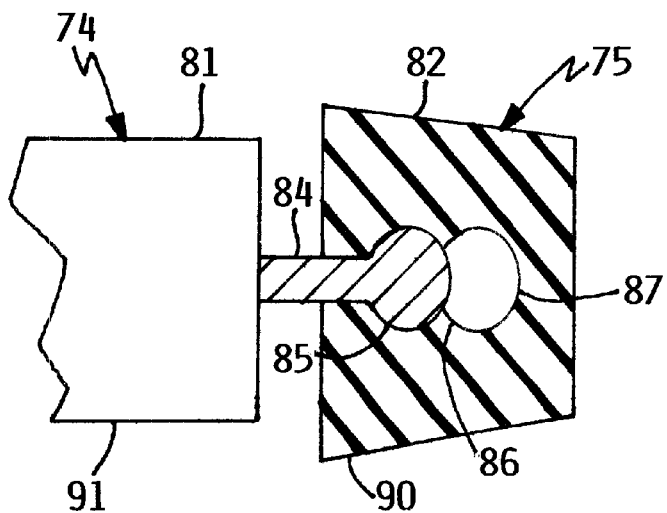
FIG. 13 is an elevation, partially in section, taken along line 13—13 of FIG. 10.

When the shock mount is moved from the first position shown in FIG. 12 to the second position shown in FIG. 13, the bulbous terminal end portion 85 of projection 84 moves from the enlarged terminal end 87 of recess 86 to the only slightly relieved portion 88 of the recess. The enlarged end 85 of projection 84 causes the elastomer of the shock mount to deform. Since the increased dimension of the projection occurs toward the upper and lower surfaces of the device 74, the distortion of the shock mount elastomer is largely limited to the vertical direction as illustrated in FIG. 13. The upper-surface 82 of the shock mount is caused to project above the plane of the device upper surface 81 and the lower surface 90 of the shock mount is similarly deformed to project beyond the plane of device lower surface 91.

With the shock mounts moved to the second position, away from the truncated corners of the device, the shock mounts violate every dimension of the form factor. Thus, should the device drop toward a planar surface one or more of the elastomeric shock mount members will make the first contact with such planar surface irrespective of the attitude of the device when contacting the surface.

While the invention has been shown and described with respect to preferred embodiments thereof, it will be understood by those skilled in the art that various changes in form and detail may be made without departing from the scope and teaching of the invention. For example, various interconnection structures might be used to mount the corner shock mount members to the device while enabling movement between the operative position within the form factor and the protective position where the form factor is violated. Biasing toward the protective position could be implemented by a more complex, but single spring element in cooperation with a track and stop elements which both limit rotation of the shock elements and control separation between shock elements and the drive as the shock elements are both rotated and moved outward by a single composite motion. Accordingly, the apparatus herein disclosed is to be considered merely illustrative and the invention is to be limited only as specified in the claims.

What is claimed is:

1. In a device which is resident within a form factor defined by specified length, width, and height dimensions, a shock mount structure comprising four elastomeric corner shock mount members, each supported on said device and movable between a first position within said form factor wherein each corner of each surface defining said form factor is defined by a surface of one of said shock mount members and a second position wherein each dimension of said form factor is exceeded, and first biasing means associated with each of said shock mount members which urges said shock mount member toward said second position.

2. The shock mount structure of claim 1 further comprising second biasing means associated with each of said shock mount members which urges such member away from said device and means limiting the separation between said shock mount member and said device induced by said second biasing means.

3. The shock mount structure of claim 2 wherein said first biasing means comprises a leaf spring element which is an insert captured by the elastomeric material of said member and said second biasing means is a spring carried by said member and captured by the elastomeric material of said member.

4. In a device having outer bounding surfaces which substantially form a rectangular parallelepiped, a shock mounting structure comprising four elastomeric members, each of which is secured to said device and movable between a first position wherein said elastomeric member is within the length, width, and height dimensions of said rectangular parallelepiped and a second position wherein said elastomeric members define planes surrounding said rectangular parallelepiped, whereby when said device falls toward a planar surface only said elastomeric members will engage said planar surface irrespective of the attitude of said device; and first biasing means associated with each of said elastomeric members which biases such member toward said second position.

5. The shock mounting structure of claim 4 wherein said first biasing means comprises a spring member carried by each of said elastomeric members which normally retains said elastomeric member at said second position and may be manually overcome to move said elastomeric member to said first position.

6. The shock mounting structure of claim 5 wherein said device includes a frame which presents projecting post members with a slotted terminal end and said elastomeric members each have a generally cylindrical recess extending from a surface confronting said device to an inner end remote from said surface confronting said device with a leaf spring insert spanning said recess near said inner end of said recess such that when one of said projecting post members is received in said recess with said leaf spring insert received in said projecting post member slot, said elastomeric member is maintained in said second position, but is movable toward said first position against the biasing force of said leaf spring.

7. The shock mounting structure of claim 6 wherein said projecting post slots are tapered at each side thereof to reduce the localized stress on the leaf spring captured in such slot when said elastomeric member is rotated toward said first position.

8. The shock mounting structure of claim 7 wherein said projecting post members have a radially enlarged portion between said slot said frame from which said post member projects and said elastomeric members have radially enlarged portions which are received about said projecting post enlarged portions to resist relative motion between said elastomeric member and said frame in the axial direction of said projecting post.

9. In a device which is resident within a form factor defined by specific length, width, and height dimensions and has truncated corners, a shock mount structure comprising a non-round projection, with a bulbous end portion, extending from said device at each truncated corner location and an elastomeric shock mount member at each truncated corner location supported on said device about said non-round projection and movable between a first position within said form factor and a second position wherein each dimension of said form factor is exceeded.

10. The shock mount structure of claim 9 wherein said device has side surfaces and upper and lower major surfaces and each shock mount in said first position has surfaces substantially coplanar with two side surfaces and the upper and lower surfaces of said device; and movement to said second position causes the surfaces previously substantially coplanar with two side surfaces to move substantially parallel to said device side surfaces and outside said form factor.

11. The shock mount structure of claim 10 wherein shock mount movement from said first position to said second position causes said non-round projection bulbous end portion to deform said elastomeric shock mount member toward said upper and said lower surfaces whereby each dimension of said form factor is exceeded.

12. The shock mount structure of claim 11 wherein each elastomeric shock mount includes a cavity that is received about said non-round projection which includes an enlarged terminal end recess which receives said bulbous projection end portion when said shock mount is in said first position and an intermediate relieved portion that serves to detent said shock mount in said second position as said bulbous end portion is received therein.

13. The shock mount structure of claim 12 wherein said non-round projection is rectangular extending from said device and has substantially parallel side surfaces throughout its length, whereby substantially all deformation induced by said bulbous end portion is directed toward the planes of said device upper and lower surfaces.

* * * * *